United States Patent
Guenther

(10) Patent No.: US 8,451,634 B2
(45) Date of Patent: May 28, 2013

(54) CIRCUIT AND METHOD OF OUTPUT POWER DETECTION FOR A CONVERTER CIRCUIT

(75) Inventor: Gary David Guenther, Warrenville, IL (US)

(73) Assignee: Texas Instruments Incorporated, Dallas, TX (US)

( * ) Notice: Subject to any disclaimer, the term of this patent is extended or adjusted under 35 U.S.C. 154(b) by 388 days.

(21) Appl. No.: 12/341,077

(22) Filed: Dec. 22, 2008

(65) Prior Publication Data

US 2010/0161256 A1 Jun. 24, 2010

(51) Int. Cl.
*H02M 3/335* (2006.01)

(52) U.S. Cl.
USPC ...................................... 363/21.13

(58) Field of Classification Search
USPC .......................... 363/21.04–21.18
See application file for complete search history.

(56) References Cited

U.S. PATENT DOCUMENTS

| | | | |
|---|---|---|---|
| 4,450,516 A * | 5/1984 | Gerard | 363/84 |
| 4,668,905 A | 5/1987 | Schierjott | |
| 5,015,939 A * | 5/1991 | Konecny | 318/701 |
| 5,247,244 A | 9/1993 | Miller et al. | |
| 5,815,380 A * | 9/1998 | Cuk et al. | 363/16 |
| 5,898,581 A * | 4/1999 | Liu | 363/53 |
| 5,991,172 A * | 11/1999 | Jovanovic et al. | 363/21.14 |
| 2003/0156434 A1* | 8/2003 | Nakanishi et al. | 363/21.01 |
| 2005/0168281 A1* | 8/2005 | Nagamori et al. | 330/133 |
| 2005/0219870 A1* | 10/2005 | Yang et al. | 363/21.01 |
| 2006/0034102 A1* | 2/2006 | Yang et al. | 363/21.13 |
| 2006/0087298 A1* | 4/2006 | Turchi | 323/265 |
| 2007/0177410 A1* | 8/2007 | Nakamura et al. | 363/21.06 |
| 2009/0196076 A1* | 8/2009 | Danstrom et al. | 363/21.15 |
| 2010/0027298 A1* | 2/2010 | Cohen | 363/21.14 |

* cited by examiner

*Primary Examiner* — Adolf Berhane
*Assistant Examiner* — Jeffrey Gblende
(74) *Attorney, Agent, or Firm* — William B. Kempler; Wade J. Brady, III; Frederick J. Telecky, Jr.

(57) ABSTRACT

A circuit and method of determining the power output for a converter circuit includes determining a time averaged voltage from a rectified voltage of a winding of the transformer and multiplying the time averaged voltage by a constant determined at least in part by an average current of a winding of the transformer. By one approach, a rectified voltage from a primary side of the transformer is time averaged using a filter circuit. The current can be known or preset or controlled by the converter circuit such that the time averaged voltage reading, assuming a constant current, can be compared to a preset voltage such that the voltage reading approximates a power reading for the transformer. By another approach, the time averaged voltage is multiplied by the current to obtain a power output reading.

18 Claims, 5 Drawing Sheets

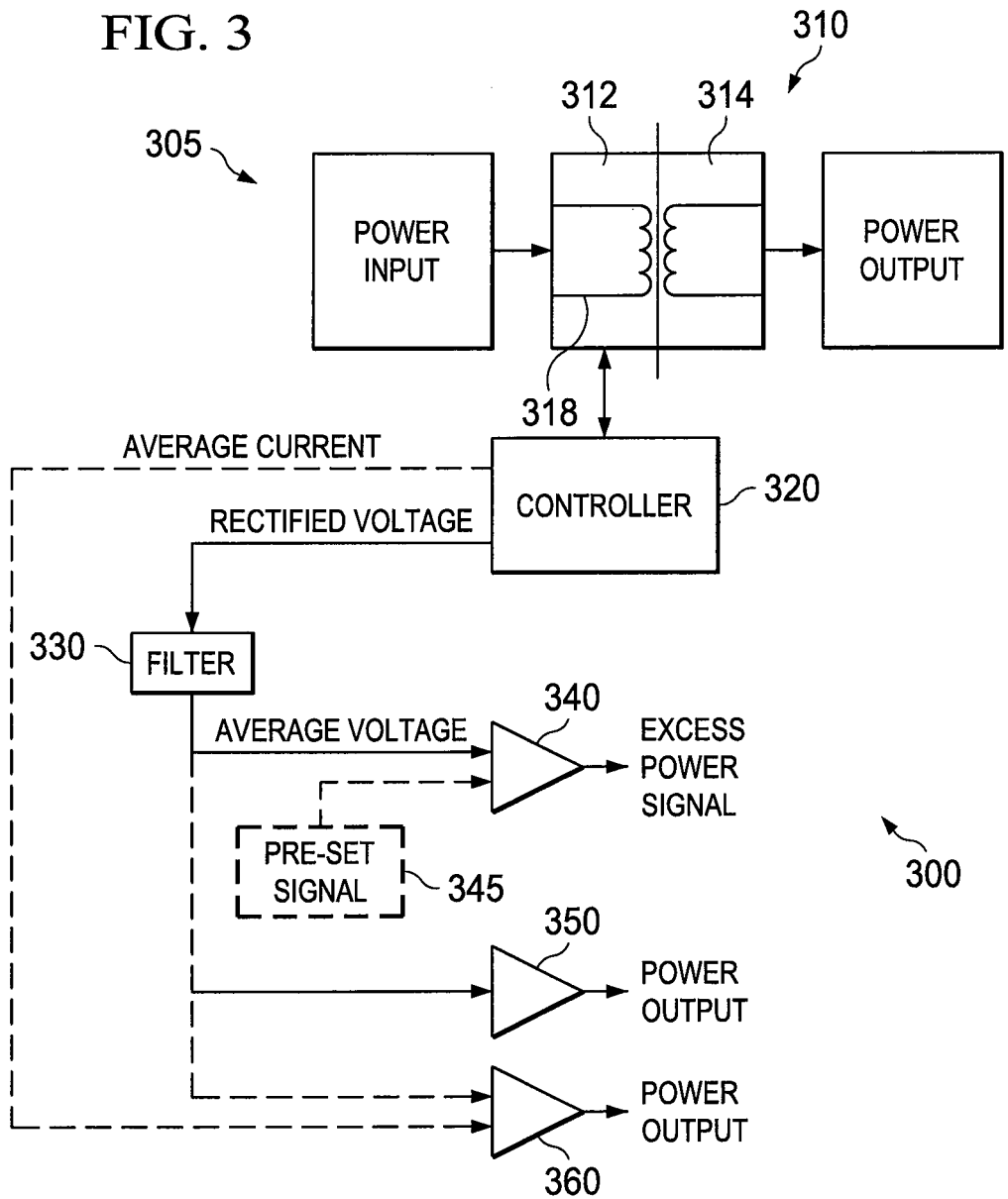

CIRCUIT AND METHOD OF OUTPUT POWER DETECTION FOR A CONVERTER CIRCUIT

TECHNICAL FIELD

This invention relates generally to power detection in transformers and more particularly, to power detection and control in converter circuits.

BACKGROUND

Converter circuits of various types to convert an electrical power type to another electrical power type are known in the art. Typically, a converter circuit will include a transformer that takes a particular type of input power and transforms it into a second type of output power. For a variety of reasons, it is advantageous to monitor and control the output power. Detecting the power output on the secondary or output side of a transformer in a converter circuit, however, includes certain drawbacks. For example, detecting power on the output side may negatively affect the power output signal from the transformer. Detecting power on the input or primary side of the transformer also has its drawbacks. For example, it is common that input voltages vary or drift over time thereby affecting the power determination. For instance, a power input to the transformer in many practical applications is provided from a wall socket outlet from which voltages may vary over time. Varying input voltages can cause inaccurate power readings from the primary side of the transformer. Another obstacle to power detection and control includes variance in the input current or current on the primary side of the transformer over time, which also renders power detection on the primary side of the transformer difficult to obtain accurately.

SUMMARY

Generally speaking and pursuant to these various embodiments, a method of determining the power output for a converter circuit includes determining a time averaged voltage from a rectified voltage of a winding of the transformer and multiplying the time averaged voltage by a constant determined at least in part by an average current of a winding of the transformer. By one approach, a rectified voltage from a primary side of the transformer is time averaged using a filter circuit. The current is known or preset or controlled by the converter circuit such that the time averaged voltage reading, assuming a constant current, can be compared to a preset voltage such that the voltage reading approximates a power reading for the transformer. By another approach, the time averaged voltage is multiplied by the current to obtain a power output reading.

So configured, the time averaged voltage reading provides an accurate measurement of the power output of a transformer and a converter circuit such that a controller for the converter circuit can use the power measurement to control the power output by the converter circuit. This power control can be used, for example, in applications where an output power to a device should be tightly controlled.

BRIEF DESCRIPTION OF THE DRAWINGS

The above needs are at least partially met through the provision of the circuit and method of output power detection for a converter circuit described in the following detailed description, particularly when studied in conjunction with the drawings wherein:

FIG. 3 comprises a block diagram of a converter circuit as configured in accordance with various embodiments of the invention;

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION OF THE PREFERRED EMBODIMENT(S)

Figure 1:
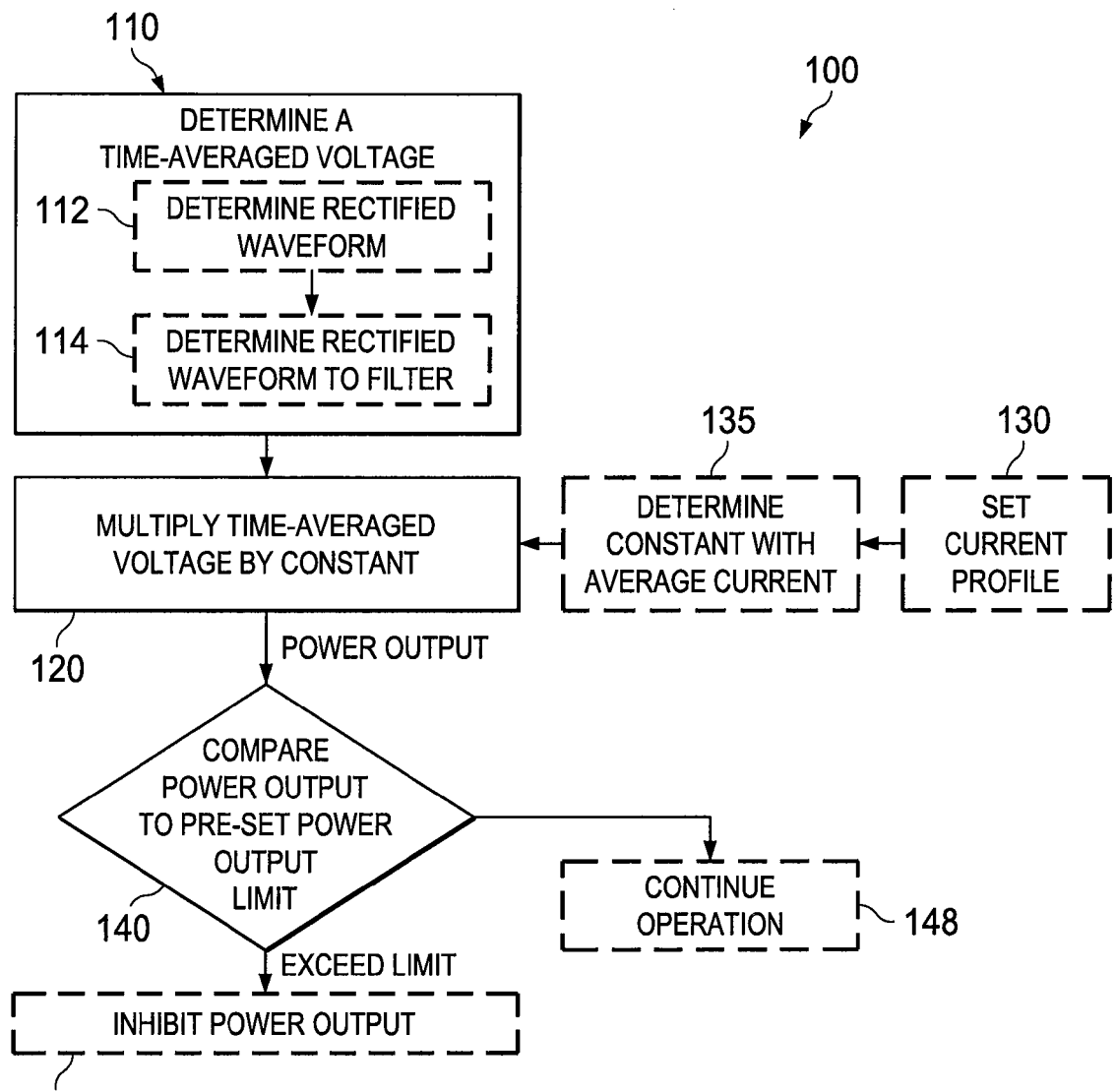
FIG. 1 comprises a flow diagram of an example method of operation of a converter circuit as configured in accordance with various embodiments of the invention.

Referring now to the drawings, and in particular to FIG. 1, an illustrative process 100 compatible with many of these teachings will now be presented. A method 100 of determining a power output of a converter circuit comprising a transformer and operating in a transition or non-continuous mode includes the step 110 of determining a time averaged voltage from a rectified voltage of a winding of the transformer. Performance of this step 110 may include determining a rectified waveform of the voltage at a controller operatively coupled to a primary side of the transformer at sub-step 112. At sub-step 114, the rectified waveform may be provided to an RC filter. At step 120, the time averaged voltage is multiplied by a constant determined at least in part by an average current of a second winding of the transformer. One skilled in the art will recognize that the transformer may have a plurality of windings on its primary side. The rectified voltage may be sensed from the same winding or a different winding as that of the average current. So configured, the winding of the transformer and the second winding of the transformer may comprise the same winding. By another approach, the winding of the transformer may comprise one of a primary winding of the transformer and a secondary winding of the transformer. By either approach, because the transformer turns ratio is known, a constant based upon the turns ratio may be used to adjust for the voltage and current readings from those windings.

With continuing reference to FIG. 1, in one approach, the average current is determined by setting at step 130 a saw tooth current profile including a peak current for the transformer and dividing the peak current by two. At step 135, the constant is determined using the average current and is provided for use at step 120. In this example, the average current for a converter circuit operating in a transition or non-continuous mode is one-half of the peak current of the saw tooth current profile, and this average current is multiplied by the turns ratio to reach the constant provided to step 120.

The method 100 may also include at step 140 comparing the output power as determined at step 120 to a preset power output limit. Then at step 145, the method includes inhibiting the power output from the transformer when the power output exceeds the preset power output limit. Should the power output not exceed the preset power output limit, at step 148, the operation of the transformer and converter circuit continues. The converter circuit operating according to this method, therefore, is able to accurately monitor its power output thereby conserving power and protecting downstream circuits from excess power outputs.

Figure 2:
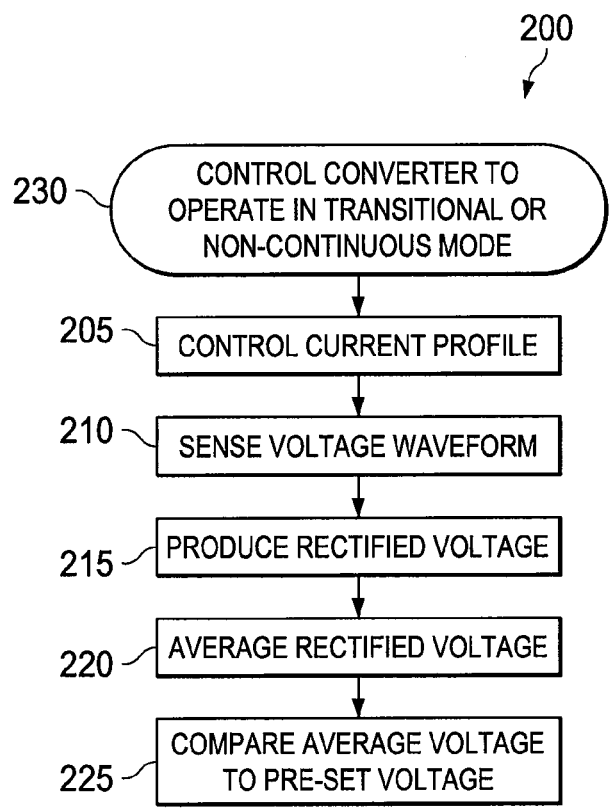
FIG. 2 comprises a flow diagram of an example method of operation for a converter circuit as configured in accordance with various embodiments of the invention.

With reference to FIG. 2, a method 200 of controlling output power from a converter circuit will be described. At step 205, the example method 200 includes controlling a current profile of a winding of a primary side of the transformer of the converter circuit to be approximately constant. By one approach, this step includes controlling the current profile of the winding of the primary side of the transformer for the converter circuit to comprise a saw tooth profile. For a converter circuit operating in a transitional or non-continuous mode, the average current for such a profile is one-half of the peak current of the saw tooth profile. Other current profiles may be used by the converter circuit where the average current for such current profiles can be obtained and used to determine the output power.

At step 210, the method 200 includes sensing a voltage waveform from a second winding of the primary side of the transformer of the converter circuit. At step 215, a rectified voltage waveform is produced from the sensed voltage waveform. The method 200 includes at step 220 averaging the rectified voltage waveform to produce an average voltage and at step 225 comparing the average voltage to a preset voltage corresponding to an output power limit. Because in this example the current profile for the converter circuit is controlled to be approximately constant resulting in an approximately constant average current, the average voltage and the preset voltage directly correspond to an output power limit for the converter circuit. At step 230, the method 200 includes providing a signal to control the output power of the converter circuit according to a function of comparing the average voltage to the preset voltage. Typically this step will include providing a signal to a controller of the converter circuit when the average voltage exceeds the preset voltage corresponding to the output power limit. As noted above, the winding of the primary side of the transformer and second winding of the primary side of the transformer may comprise the same winding or different windings.

So configured, a converter circuit may be controlled such that its output power does not exceed a preset limit without actually calculating the output power for the circuit. Instead, by controlling the current through a winding of the transformer to be approximately constant, the average rectified voltage can be used as a direct measurement of the output power such that a feedback signal may be provided to a controller to control the converter circuit output power below a preset limit. In this example, the method includes controlling the converter circuit to operate in a transitional or non-continuous mode. In such an example, controlling the current to be a saw tooth profile allows the average current to be readily maintained assuring consistent output power readings.

Referring now to FIG. 3, an illustrative approach to such a platform for performing the above methods will now be provided. A circuit 300 to determine a power output of a converter circuit 305 includes a converter circuit 305 comprising a transformer 310 with a primary side 312 and a secondary side 314. A controller circuit 320 is operatively coupled to the primary side 312 of the transformer 310 to control a current profile for the transformer 310. The controller circuit is also operatively coupled to the primary side 312 of the transformer 310 to produce a rectified voltage waveform in response to a voltage waveform from a winding 318 of the primary side 312 of the transformer 310. A filter circuit 330 is operatively coupled to receive the rectified voltage waveform from the controller circuit 320 to provide an averaged voltage signal. The averaged voltage signal may be processed or managed in a variety of different ways.

By one approach, a comparator circuit 340 is coupled to receive the averaged voltage signal and compare the averaged voltage signal to a preset voltage signal 345. The comparator circuit 340 provides a signal when the averaged voltage signal exceeds the preset voltage signal. Because the current profile for the transformer 310 is controlled, the averaged voltage signal and preset voltage signal correspond to the output power for the transformer 310 such that the signal provided by the comparator circuit 340 indicates whether the transformer 310 provides excess power.

By another approach, an amplifier 350 having a fixed gain is operatively coupled to receive the average voltage signal from the filter circuit 330 wherein the fixed gain is set according to a preset average current for a winding 318 of the primary side 312 of the transformer 310. In this approach, the amplifier 350 provides the power output for the converter circuit 305 because the fixed gain corresponds to the average current, and, as is known in the art, the power output is equal to voltage times current.

By still another approach, a multiplier circuit 360 is operatively coupled to receive the average voltage signal from the filter circuit 330 and an average current signal for the transformer 310 from the controller circuit 320. The multiplier circuit 360 is configured to multiply the average voltage signal by the average current signal to provide the power output.

In a one application, the converter circuit 305 comprises a flyback converter circuit configured to operate in a transitional mode or non-continuous mode. In this configuration, the controller circuit 320 is configured to provide a saw tooth current profile that remains approximately constant during operation of the converter circuit 305. This saw tooth current profile for the winding 318 of the transformer 310 allows for relatively easy current calculation, by taking one-half of the peak current for the saw tooth current profile. Other current profiles may be used by the converter circuit 300 where the average current for such current profiles can be obtained and used to determine the output power.

The calculations supporting the power output determination are described below with reference to the graph at FIG. 4. In a conventional flyback power supply topology, such as in a flyback converter circuit, energy is transferred by first being stored in the primary inductance of the transformer 310, and then being discharged into the output 314 winding(s). If the converter circuit is being operated in transition mode or in discontinuous mode, then all of the energy stored in the primary inductance is delivered to the output side 314 of the converter circuit 300 during each switching cycle.

Ignoring losses, the power transferred to the output side 314 of a flyback converter circuit operating in either discontinuous or transition mode is equal to the power stored in the primary inductance and is defined by Equation 1 where $P_{out}$ is the power output, $L_{primary}$ is the inductance of the primary winding of the transformer, $I_{peak}$ is the peak current of the primary winding, and $T_{period}$ is the total cycle time for the circuit.

$$P_{out} \cong \frac{L_{primary} \times I_{peak}^2}{2 \times T_{period}} \quad \text{Equation 1}$$

The primary inductance $L_{primary}$ will normally vary with production tolerances and not be known with good precision, however the peak primary current $I_{peak}$ is set by the pulse width modulation (PWM) controller as known in the art and may be known with good precision.

The peak primary current is described by Equation 2 where $V_{in}$ is the input voltage and $t_{on}$ is the time period over which the input voltage is provided to the transformer 310.

$$I_{peak} = \frac{V_{in} \times t_{on}}{L_{primary}} \quad \text{Equation 2}$$

Equation 2 may be rearranged in terms of the primary inductance to yield Equation 3.

$$L_{primary} = \frac{V_{in} \times t_{on}}{I_{peak}} \quad \text{Equation 3}$$

Substituting Equation 3 into Equation 1 yields Equation 4, which provides an approximate equation for output power that does not require knowledge of the value of the primary inductance.

$$P \cong \frac{V_{in} \times t_{on}}{I_{peak}} \times \frac{I_{peak}^2}{2 \times T_{period}} = \frac{V_{in} \times t_{on}}{T_{period}} \times \frac{I_{peak}}{2} \quad \text{Equation 4}$$

Figure 4:
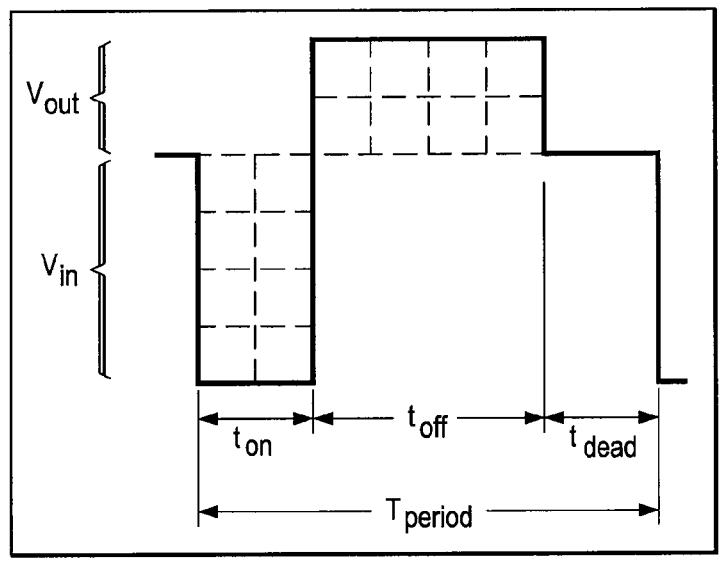
FIG. 4 comprises a graph of an example flyback converter circuit transformer voltage waveform showing voltage in and voltage out over a single cycle or time period of operation.

Referring to FIG. 4, the primary volt-second product is the product of the input voltage or voltage applied to a winding of the primary side 312 of the transformer 310, $V_{in}$, and the time during which the input voltage is applied, $t_{on}$, as described by Equation 5.

$$Vs_{primary} = V_{in} \times t_{on} \quad \text{Equation 5}$$

It is well known that the secondary volt-second product is equal to the primary volt-second product. The secondary volt-second product is the product of the output voltage or voltage on a winding of the secondary side 314 of the transformer 310, $V_{out}$, and the time during which the output voltage is applied, $t_{off}$, as described by Equation 6.

$$Vs_{secondary} = V_{out} \times t_{off} \quad \text{Equation 6}$$

Averaging either the primary or secondary volt-second product independently over time results in the voltages described by Equation 7 and Equation 8, respectively.

$$Vs_{primary\_average} = \frac{V_{in} \times t_{on}}{T_{period}} \quad \text{Equation 7}$$

$$Vs_{secondary\_average} = \frac{V_{out} \times t_{off}}{T_{period}} \quad \text{Equation 8}$$

Because the volt-second products of the primary side 312 of the transformer 310 and reflected secondary side 314 of the transformer 310 are equal, Equation 7 and Equation 8 are also equal.

By inspection, it can be seen that the first term on the right side of Equation 4

$$\left( \frac{V_{in} \times t_{on}}{T_{period}} \right)$$

is identical to the term on the right side of Equation 7. Consequently, Equation 4 can be rewritten in terms of either Equation 9 or Equation 10.

$$P_{out} \cong Vs_{primary\_average} \times \frac{I_{peak}}{2} \quad \text{Equation 9}$$

$$P_{out} \cong Vs_{secondary\_average} \times \frac{I_{peak}}{2} \quad \text{Equation 10}$$

In an ideal application, the peak current on the primary side 312 of the transformer 310 at full load is fixed and known with good precision. Therefore, the output power of the converter circuit 300 can be determined by multiplying the time averaged rectified voltage waveform of either the primary 312 or secondary side 314 of the transformer 310 by a fixed constant relating to the peak current.

Figure 5A:
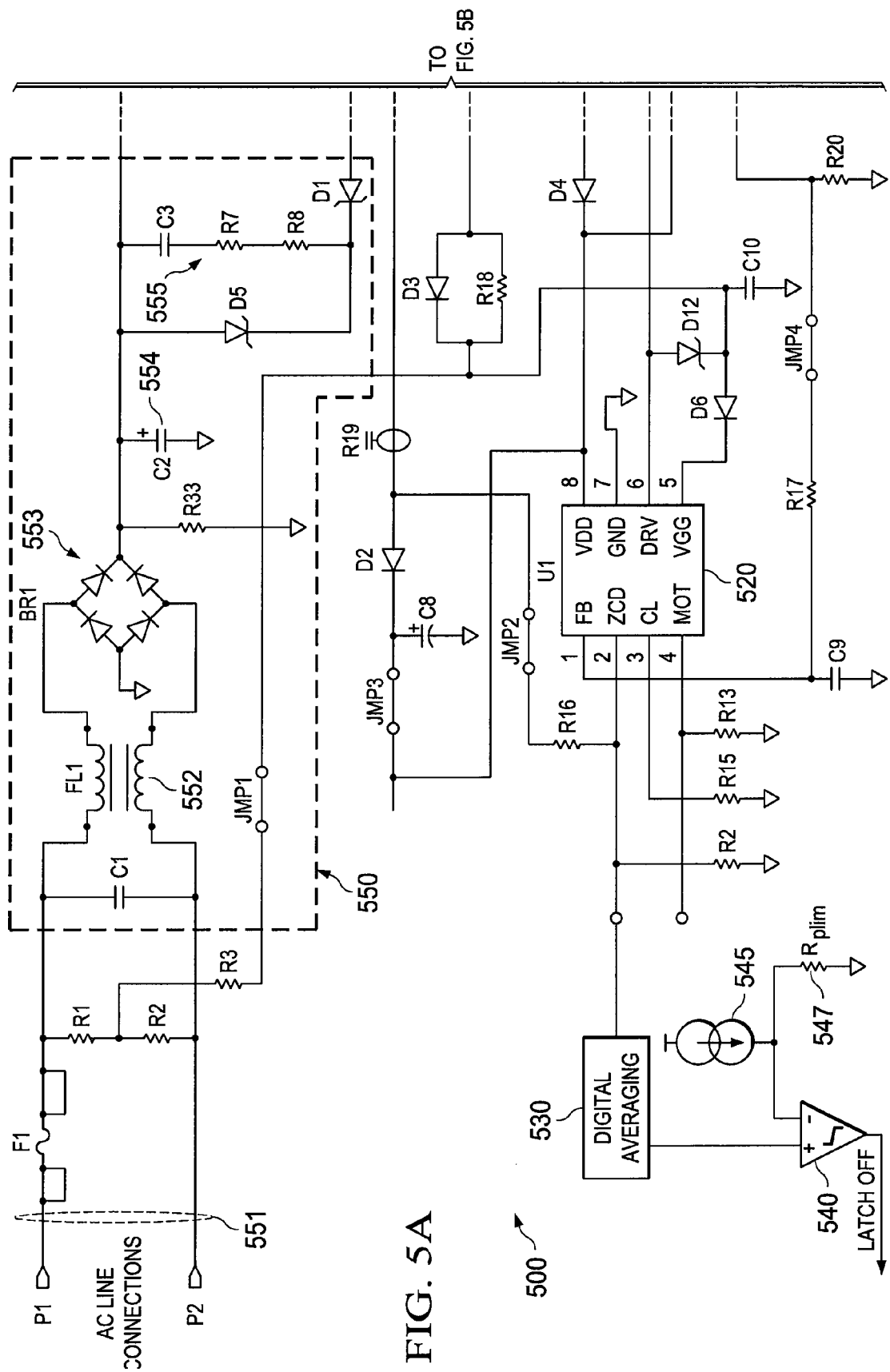
FIG. 5 comprises a circuit diagram of an example flyback converter circuit as configured in accordance with various embodiments of the invention.
Figure 5B:
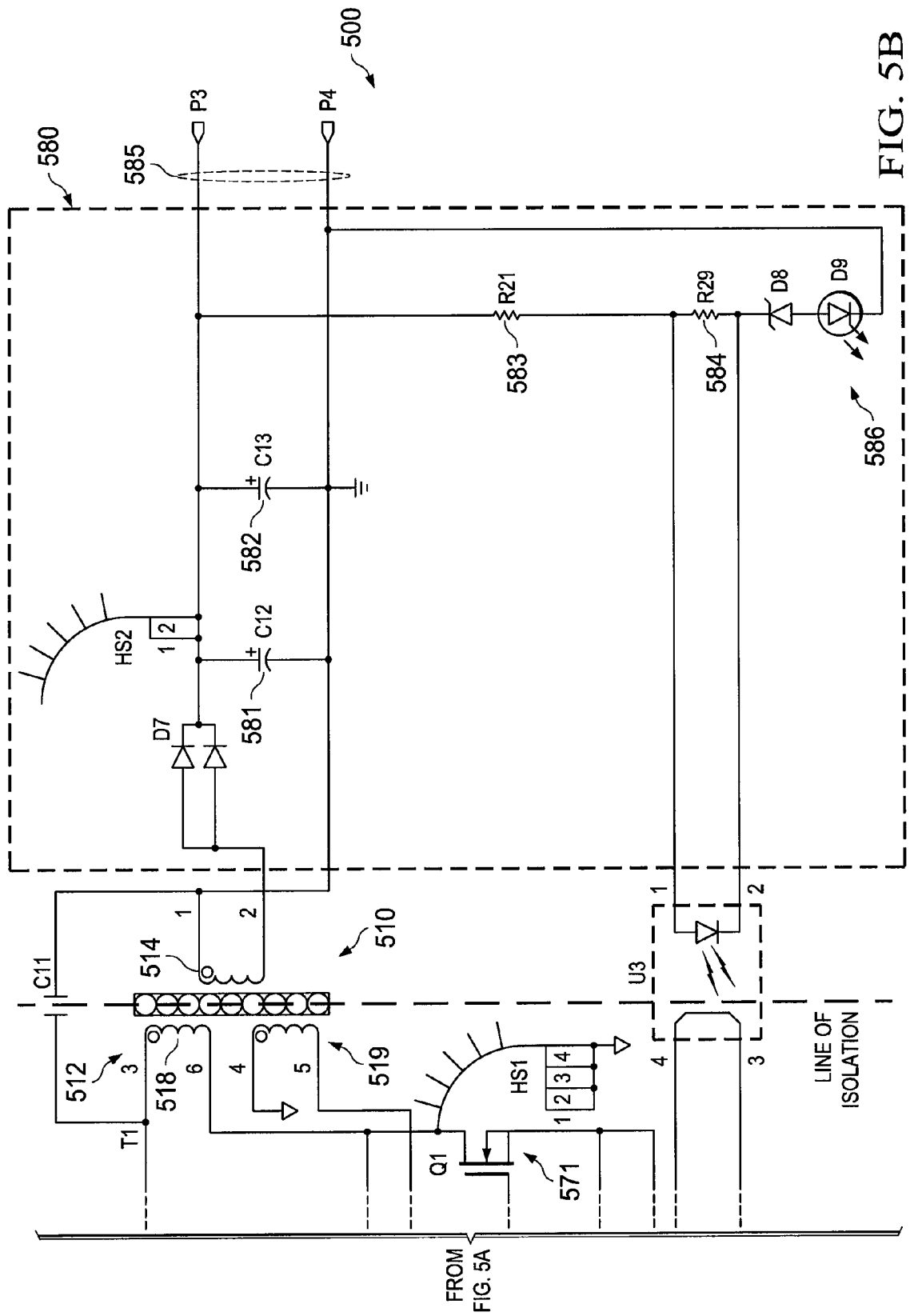

Turning to FIG. 5, an example flyback converter circuit 500 operating in a transitional or non-continuous mode with output power control will be described. The flyback converter circuit 500 operates in a transitional or non-continuous mode and includes a transformer 510 with a primary side 512 and a secondary side 514 wherein power from the secondary side 514 comprises the output power. A controller circuit 520 is operatively coupled to a winding 518 of the primary side 512 of the transformer 510 to control a current in the winding 518. In this example, the current comprises a saw tooth current profile that remains approximately constant. The controller circuit 520 in this example is a Texas Instruments No. UCC28610 chip, which is programmable to control the current according to a pre-set peak current and waveform such as the saw tooth current profile.

The controller circuit 520 is operatively coupled to a second winding of the primary side 512 of the transformer 510 to sense the voltage of the second winding 519. The controller circuit 520 is configured to provide a rectified voltage waveform from the voltage of the second winding 519 of the primary side 512 of the transformer 510. A digital averaging circuit 530 acting as a filter is operatively coupled to the controller circuit 520 to receive the rectified voltage waveform. The digital averaging circuit 530 is a time averaging filter for the rectified voltage waveform received from the controller circuit 520. A comparator circuit 540 is operatively coupled to the digital averaging circuit 530 to receive an average voltage signal from the digital averaging circuit 530. The comparator circuit 540 is operatively coupled to a preset voltage signal provided from a preset current source 545 and a resistor 547. The comparator circuit 540 is configured to provide a signal when the average voltage signal from the digital averaging circuit 530 exceeds the preset voltage signal.

The comparator circuit 540, in this example, is operatively coupled to the controller circuit 520 to provide the signal to the controller circuit 520 when the average voltage signal exceeds the preset voltage signal. The controller circuit 520 is then configured to reduce the output power for the transformer 510 in response to receiving the signal when the average voltage signal exceeds the preset voltage signal.

The remaining circuit elements shown in FIG. 5 comprise additional elements as may be used in one example embodiment for flyback converter circuit to be operated in a transitional or non-continuous mode described herein. For example, a rectifier circuit 550 is coupled between an alternating current (AC) power line connection 551 and the transformer 510. The rectifier circuit 550 generally includes an inductor 552, a full-wave bridge 553, a capacitor 554, and a filter 555. The rectifier circuit 550 generally converts the AC power to a direct current (DC) signal. Circuitry between the controller circuit 520 and the transformer 510 such as MOSFET 571 condition the signaling among the various elements. On the output side 580 of the circuit 500, capacitors 581 and 582 and resistors 583 and 584 further condition the output signal provided on the output line 585. A light emitting diode 586 indicates whether power is being applied to the output line 585. One skilled in the art will recognize that a variety of modifications to such circuit elements can be performed without departing from the teachings described herein.

So configured, a flyback converter circuit efficiently and reliably controls the power output from the circuit. For example, a flyback converter circuit such as that described herein may be used to convert power from a wall outlet for use by a variety of electronic devices. Should the electronic device have a sensitivity to a particular power output, a converter circuit as described herein can reliably limit the power output and not damage the connected electronic devices. The flyback converter circuit in one approach uses the primary side of the transformer to measure and/or control the voltages and currents used for output power control without affecting the output power quality. Such an approach can be implemented without the addition of many additional components thereby providing reliable power output protection without substantially increasing the manufacturing cost for such converter circuits.

Those skilled in the art will recognize that a wide variety of modifications, alterations, and combinations can be made with respect to the above described embodiment, without departing from the scope of the invention, and that such modifications, alterations, and combinations are to be viewed as being without the ambit of the inventive concept.

What is claimed is:

1. A method of operating a flyback converter circuit, the method comprising:
   providing power to a transformer to operate the flyback converter in a transitional or discontinuous mode having a pre-set current for a primary winding of the transformer;
   determining a time-averaged voltage from a rectified voltage of a first winding of the transformer;
   determining a constant at least in part from the pre-set current of a primary side of the transformer, the constant being related to the magnitude of the pre-set current;
   multiplying the time-averaged voltage by the constant to calculate a power output utilizing an amplifier with a fixed gain operatively coupled to receive the average voltage signal wherein the fixed gain is set according to a pre-set average current for the primary winding of the transformer such that the amplifier provides a signal indicative of the DC output power level of the converter; and
   comparing the DC output power level to a pre-set output power limit to determine whether the DC output power level has exceeded the pre-set output power limit.

2. The method of claim 1, wherein the first winding of the transformer is part of the primary winding.

3. The method of claim 1, wherein the step of determining the time-averaged voltage from the rectified voltage of the first winding of the transformer further comprises the step of determining a rectified waveform of the rectified voltage at a controller operatively coupled to a winding on a primary side of the transformer and providing the rectified waveform to a filter.

4. The method of claim 1 wherein, the method further comprises the step of determining the average current by:
   setting and maintaining a saw-tooth current profile including a peak current for the transformer; and
   dividing the peak current by two.

5. The method of claim 1 further comprising inhibiting power output from the transformer when the power output exceeds the pre-set power output limit.

6. An apparatus comprising:
   a flyback converter circuit operating in discontinuous or transitional mode and having a transformer with a primary side winding and a secondary side winding;
   a controller circuit operatively coupled to the primary side winding of the transformer to control a current profile in the transformer to generate a pre-set peak current in the primary side winding of the transformer and to produce a rectified voltage waveform in response to a voltage waveform at the primary side winding of the transformer;
   a filter operatively coupled to receive the rectified voltage waveform from the controller circuit to provide an average voltage signal; and
   an amplifier with a fixed gain operatively coupled to receive the average voltage signal wherein the fixed gain is set according to a pre-set average current for the winding of the primary side of the transformer such that the amplifier provides a signal indicative of an output DC power level.

7. The apparatus of claim 6, further comprising a comparator circuit coupled to receive the average voltage signal and compare the average voltage signal to a pre-set voltage signal.

8. The apparatus of claim 7, wherein the comparator circuit provides a signal when the average voltage signal exceeds the pre-set voltage signal.

9. The apparatus of claim 6, wherein the controller circuit operatively coupled to the primary side of the transformer to control a current profile for the transformer is further configured to provide a saw-tooth current profile that remains approximately constant during operation of the converter circuit.

10. The apparatus of claim 7, wherein the filter is an RC filter or a digital averaging circuit.

11. An apparatus comprising:
   a flyback converter circuit operating in a transitional mode, the flyback converter circuit including a transformer with a primary side and a secondary side, wherein power from the secondary side comprises a DC output power, and wherein the primary side includes a first and a second winding;

a controller circuit operatively coupled to the first and second windings of the primary side of the transformer, wherein the controller circuit controls the current in the first winding and is configured to provide a rectified voltage waveform from the voltage of the second winding, and wherein the current has a saw-tooth profile that remains approximately constant;

a filter operatively coupled to the controller circuit to receive the rectified voltage waveform;

a comparator circuit operatively coupled to the filter to receive an average voltage signal from the filter and operatively coupled to a pre-set voltage signal scaled according to a turns-ratio of the transformer, wherein the average voltage signal is indicative of the DC output power level of the converter and the comparator circuit is configured to provide a signal when the average voltage signal exceeds the pre-set voltage signal.

12. The circuit of claim 11 wherein the first winding of the primary side of the transformer and the second winding of the transformer are the same winding.

13. The circuit of claim 11, wherein the comparator circuit is operatively coupled to the controller circuit to provide the signal when the average voltage signal exceeds the pre-set voltage signal to the controller circuit, and wherein the controller circuit is configured to reduce the output power in response to receiving the signal when the average voltage signal exceeds the pre-set voltage signal.

14. The apparatus of claim 11, wherein the filter is an RC filter or digital averaging circuit.

15. A method of controlling DC output power from a flyback converter circuit comprising:

controlling a current profile of a first winding of a primary side of a transformer of the converter circuit to be approximately constant;

sensing a voltage waveform from a second winding of the primary side of the transformer of the converter circuit;

producing a rectified voltage waveform from the voltage waveform;

averaging the rectified voltage waveform to produce an average voltage;

comparing the average voltage to a pre-set voltage corresponding to an output power limit;

providing a signal according to a function of the comparing the average voltage to the pre-set voltage to control the DC output power level of the converter circuit.

16. The method of claim 15, wherein the method further comprises the step of controlling the converter circuit to operate in a transitional mode.

17. The method of claim 15, wherein step of controlling the current profile of the winding of the primary side of the transformer of the converter circuit to be approximately constant further comprises the step of controlling the current profile of the winding of the primary side of the transformer of the converter circuit to comprise a saw-tooth profile.

18. The method of claim 15, wherein the winding of the primary side of the transformer and the second winding of the primary side of the transformer comprise the same winding.

* * * * *